United States Patent
Dias et al.

(10) Patent No.: US 6,790,709 B2
(45) Date of Patent: Sep. 14, 2004

(54) BACKSIDE METALLIZATION ON MICROELECTRONIC DICE HAVING BEVELED SIDES FOR EFFECTIVE THERMAL CONTACT WITH HEAT DISSIPATION DEVICES

(75) Inventors: Rajen Dias, Phoenix, AZ (US); Biju Chandran, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 86 days.

(21) Appl. No.: 10/000,252

(22) Filed: Nov. 30, 2001

(65) Prior Publication Data

US 2003/0104679 A1 Jun. 5, 2003

(51) Int. Cl.⁷ .................. H01L 21/301; H01L 21/46; H01L 21/78
(52) U.S. Cl. .................. 438/122; 438/462; 257/620; 257/701; 257/718
(58) Field of Search .................. 438/121, 122, 438/462; 257/620, 701, 718

(56) References Cited

U.S. PATENT DOCUMENTS

| | | | | |
|---|---|---|---|---|
| 5,693,981 A | * | 12/1997 | Schneider et al. | 257/718 |
| 5,936,304 A | * | 8/1999 | Lii et al. | 257/701 |
| 6,049,124 A | | 4/2000 | Raiser et al. | |
| 6,455,920 B2 | * | 9/2002 | Fukasawa et al. | 257/620 |

* cited by examiner

*Primary Examiner*—Alexander Ghyka
(74) *Attorney, Agent, or Firm*—Rob G. Winkle

(57) ABSTRACT

A microelectronic device and methods of fabricating the same comprising a microelectronic die having an active surface, a back surface, and at least one side. The microelectronic die side comprises a beveled sidewall and a channel sidewall. A metallization layer is disposed on the microelectronic die back surface and the beveled sidewall.

6 Claims, 8 Drawing Sheets

BACKSIDE METALLIZATION ON MICROELECTRONIC DICE HAVING BEVELED SIDES FOR EFFECTIVE THERMAL CONTACT WITH HEAT DISSIPATION DEVICES

BACKGROUND OF THE INVENTION

1. Field of the Invention

The present invention relates to the backside metallization and dicing of microelectronic device wafers. In particular, the present invention relates to forming a substantially V-shaped notch extending into the microelectronic device wafer from a back surface thereof prior to metallization and dicing.

2. State of the Art

In the production of microelectronic devices, integrated circuitry is formed in and on semiconductor wafers, which is usually comprised primarily of silicon, although other materials such as gallium arsenide and indium phosphide may be used. As shown in FIG. 8, a single microelectronic device wafer 200 may contain a plurality of substantially identical integrated circuit areas 202, which are usually substantially rectangular and arranged in rows and columns. Two sets of mutually parallel sets of lines or "scribe streets" 204 extend perpendicular to each other over substantially the entire surface of the microelectronic device wafer 200 between each discrete integrated circuit area 202.

After the integrated circuit areas 202 have been subjected to preliminary testing for functionality (wafer sort), the microelectronic device wafer 200 is diced (cut apart), so that each area of functioning integrated circuitry 202 becomes a microelectronic die that can be used to form a packaged microelectronic device. One exemplary microelectronic wafer dicing process uses a circular diamond-impregnated dicing saw, which travels down the scribe streets 204 lying between each of the rows and columns. Of course, the scribe streets 204 are sized to allow passage of a wafer saw blade between adjacent integrated circuit areas 202 without causing damage to the circuitry therein.

As shown in FIGS. 9 and 10, a microelectronic device wafer 200 may have guard rings 206 which substantially surround the integrated circuit areas 202. The guard rings 206 extend though an interconnection layer 208 (see FIG. 10). The interconnection layer 208 comprises layers 212 of metal traces separated by layers of dielectric material layers on a semiconductor wafer 214. The interconnection layer 208 provides routes for electrical communication between integrated circuit components within the integrated circuits. The guard ring 206 is generally formed layer by layer as each layer 212 is formed. The guard ring 206 assists in preventing external contamination encroaching into the integrated circuitry 202 between the layers 212. The microelectronic device wafer 200 also includes a backside metallization layer 216 on a back surface 218 of the semiconductor wafer 214, which will be subsequently discussed.

Prior to dicing, the microelectronic device wafer 200 is mounted onto a sticky, flexible tape 222 (shown in FIG. 10) that is attached to a ridge frame (not shown). The tape 222 continues to hold the microelectronic die after the dicing operation and during transport to the next assembly step. As shown in FIGS. 11 and 12, a saw cuts a channel 220 in the scribe street 204 through the interconnection layer 208, the semiconductor wafer 214, and the backside metallization layer 216. During dicing, the saw generally cuts into the tape 222 to up to about one-third of its thickness. The dicing of the wafer forms individual microelectronic dice 224.

As shown in FIG. 13, a microelectronic die 224 is attached to a substrate 226, such as a motherboard, by a plurality of solder balls 228 extending between interconnection layer 208 and the substrate 226. A heat dissipation device 232 is attached to the backside metallization layer 216 by a thermal interface material 234. The thermal interface material 234 is usually a solder material including, but not limited to, lead, tin, indium, silver, copper, and alloys thereof. However, it is well known that most solders do not wet (i.e., stick to) semiconductor wafers 214 (particularly silicon-based semiconductor wafers). Thus, the backside metallization layer 216 is selected to adhere to the semiconductor wafer back surface 218 and wet with the thermal interface material 234. The backside metallization layer 216 is usually a metal material including, but not limited to, gold, silver, nickel, and the like.

However, in the dicing of microelectronic device wafers 200, dicing saws (metal impregnated with diamond) may cause chipping of the backside metallization layer 216 to expose a portion of the semiconductor wafer back surface 218. Since the thermal interface material 234 does not wet the semiconductor wafer back surface 218, microgaps 236 form between the thermal interface material 234 and the semiconductor wafer back surface 218, and a poor (sagging) thermal interface material fillet 238 results between the heat dissipation device 232 and the backside metallization layer 216, as shown in FIG. 14.

During the operation of the microelectronic die 224 stresses occur at the interface between the backside metallization layer 216 and the thermal interface material 234, particularly at corners/edges 244 of the microelectronic die 224. These stresses can result in delamination, generally starting at the microelectronic die corners/edges 242. This delamination results in a decrease in thermal conductivity and moisture encroachment. With a decrease in thermal conductivity comes the risk of overheating in the microelectronic die 224, which can result in the damage or destruction thereof. The microgaps 236 and the poor thermal interface material fillet 238 exacerbate the delamination.

Therefore, it would be advantageous to develop techniques to effectively dice microelectronic device wafers while reducing or substantially eliminating the possibility of delamination propagation.

BRIEF DESCRIPTION OF THE DRAWINGS

While the specification concludes with claims particularly pointing out and distinctly claiming that which is regarded as the present invention, the advantages of this invention call be more readily ascertained from the following description of the invention when read in conjunction with the accompanying drawings in which:

DETAILED DESCRIPTION OF THE ILLUSTRATED EMBODIMENT

Figure 1:
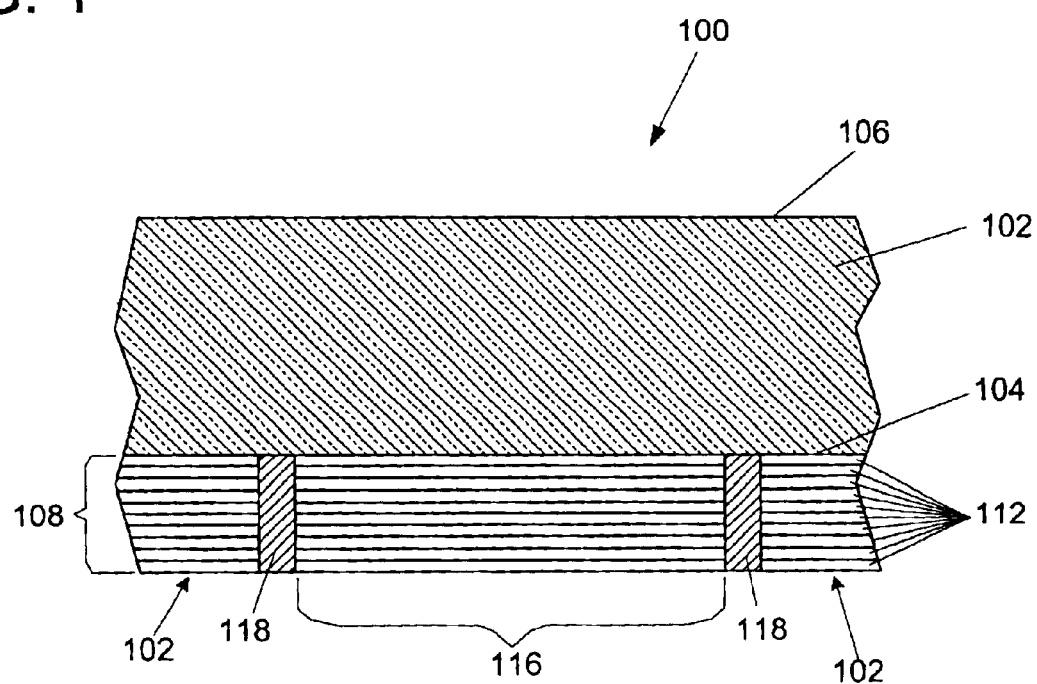
FIG. 1 is a side cross-sectional view of a microelectronic device wafer, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of tile invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention includes forming a substantially V-shaped notch in the back surface of a microelectronic device wafer, opposite scribe streets thereof, prior to backside metallization. When the microelectronic wafer is diced into separate microelectronic dice, the dice channel meets the substantially V-shaped notch. This results in a microelectronic die structure that greatly reduces or prevents delamination between the backside metallization and a thermal interface material subsequently applied to form a thermal contact between the microelectronic die and a heat dissipation device.

FIG. 1 illustrates a microelectronic device wafer 100 comprising a semiconductor wafer 102, including, but not limited to, silicon, gallium arsenide and indium phosphide, having an active surface 104 containing the microelectronic device circuitry (not shown) and a back surface 106. The microelectronic device wafer 100 further includes an interconnection layer 108 disposed on the semiconductor wafer active surface 104. The interconnection layer 108 provides routes for electrical communication between integrated circuit components within the integrated circuits. It is, of course, understood that the use of the term "wafer" does not only include an entire wafer, but also includes portions thereof.

The interconnection layer 108 are generally alternating layers 112 of dielectric material, including but not limited to silicon dioxide, silicon carbide, silicon oxy fluoride, carbon doped silicon oxides, silicon nitride, epoxy resin, polyimide, bisbenzocyclobutene, and the like, and layers of patterned electrically conductive material, including copper, aluminum, alloys thereof, and the like. The methods and processes for fabricating the interconnection layer 108 will be evident to those skilled in the art.

Figure 9:
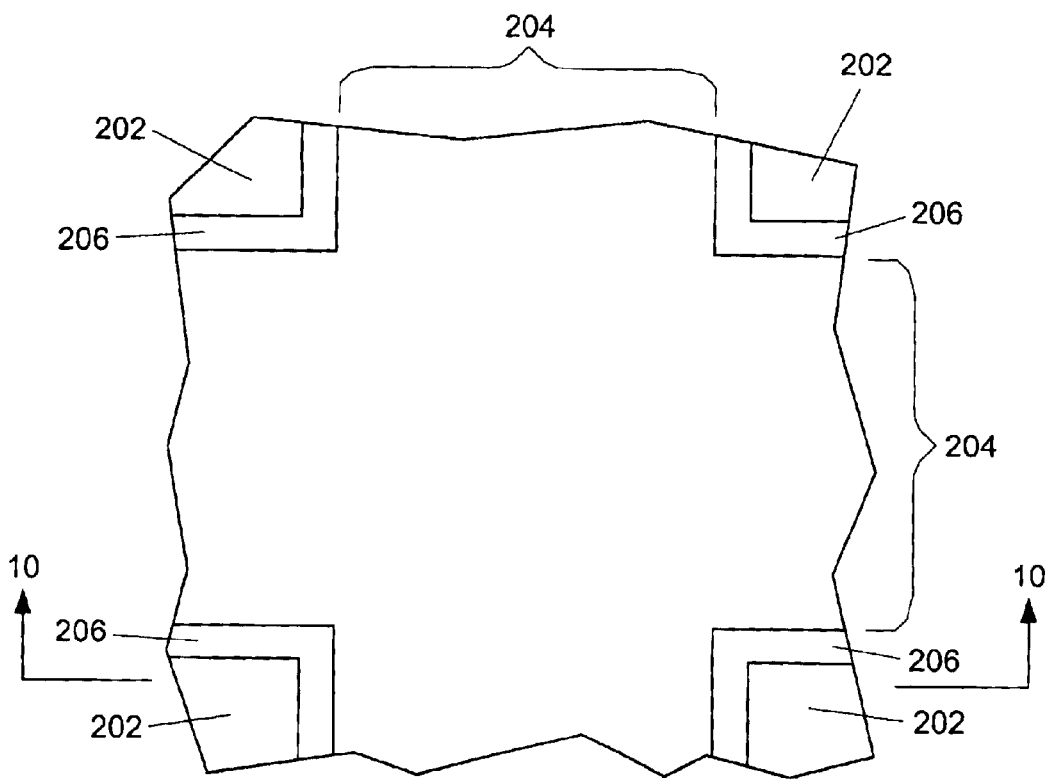
FIG. 9 is a top plan close-up view of insert 9 of FIG. 8 showing the scribe street areas, as known in the art.

As previously discussed, a plurality of scribe streets 116 separates the individual integrated circuitry areas 114. Generally the scribe streets 116 run perpendicularly to separate the integrated circuitry areas 114 into rows and columns. Preferably, at least one guard ring 118 isolates integrated circuitry areas 114 from the scribe streets 116, as discussed previously in relation to FIGS. 9 and 10.

Figure 2:
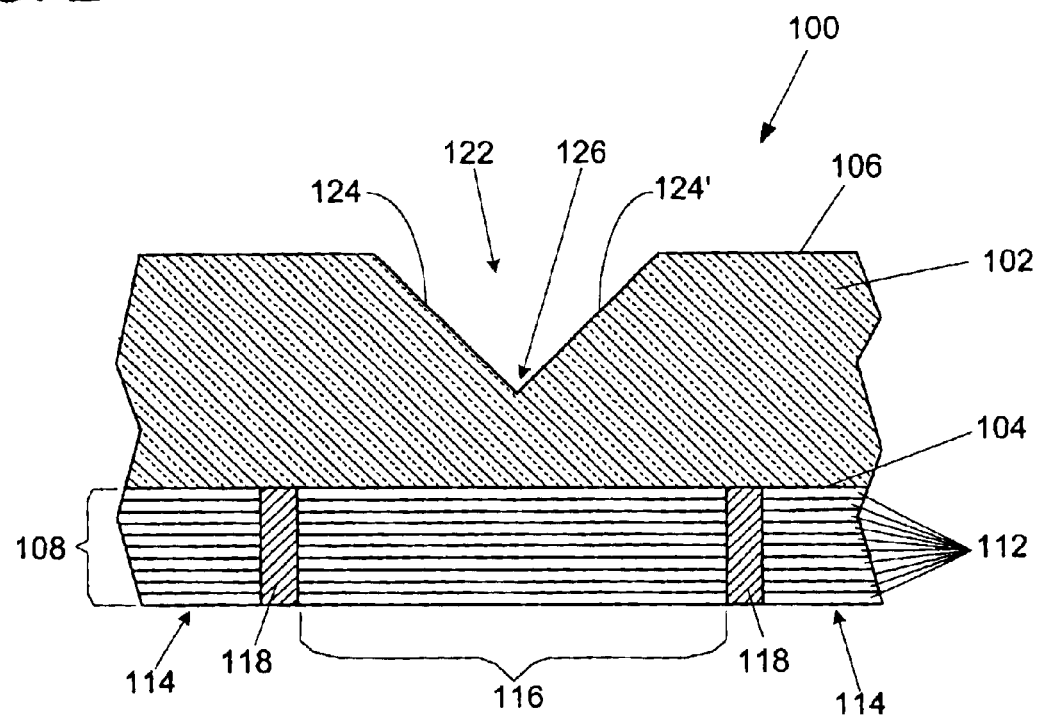
FIG. 2 is a side cross-sectional view of a substantially V-shaped notch formed in the back surface of a microelectronic device wafer opposing a scribe street area thereof, according to the present invention.

As shown in FIG. 2, a substantially V-shaped notch 122 is formed in the semiconductor wafer back surface 106. The substantially V-shaped notch 122 may be formed by any technique known in the art, including, but not limited to, laser ablation, laser milling, laser chemical etching, dry or wet etching, and a wafer saw. The substantially V-shaped notch is a preferably formed with a wafer saw having a 45 degree edge tip that is impregnated with diamond. The debris generated from the wafer saw may be removed by any cleaning technique known in the art. Preferably, the cleaning technique comprises a water spray followed by a jet of air across the semiconductor wafer back surface 106 and repeated till the debris is removed.

The substantially V-shaped notch 122 includes two sidewalls 124 and 124' that terminate at an intersection location 126 within the semiconductor wafer 102. The substantially V-shaped notch 122 is preferably formed by bevel cuts are made in two orthogonal directions and each cut is centered between scribe lines (i.e., edges of the scribe streets 116 (not shown)) visible from the microelectronic wafer device active side 104.

Figure 3:
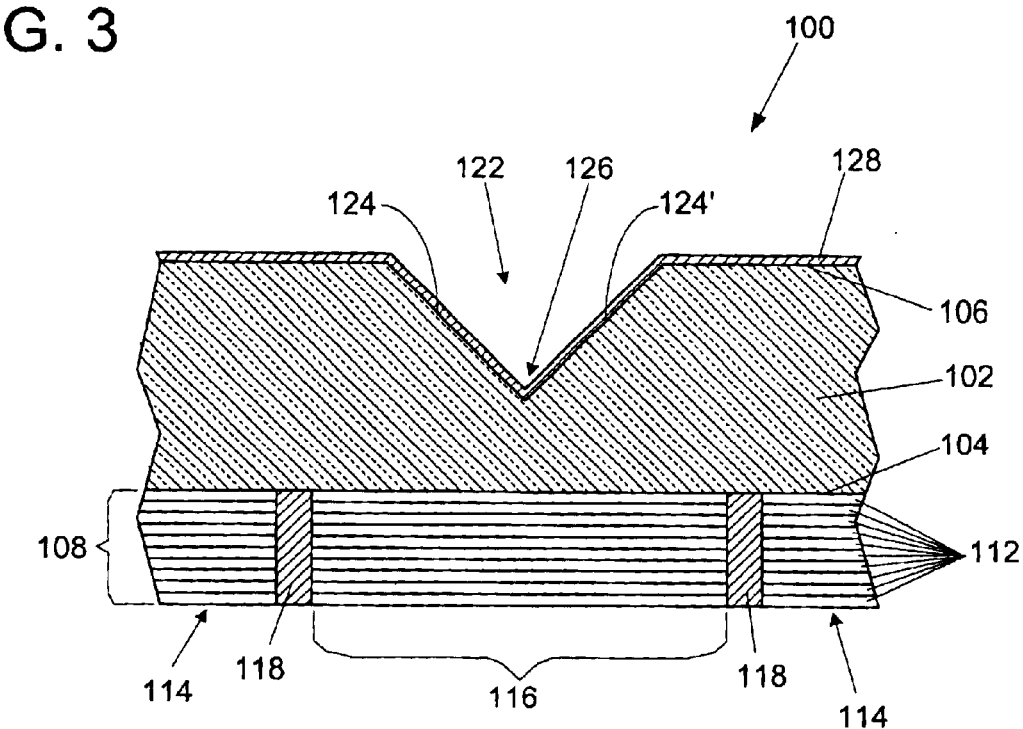
FIG. 3 is a side cross-sectional view of the microelectronic device wafer having a backside metallization layer disposed on a back surface of the semiconductor wafer and the substantially V-shaped notch, according to the present invention.
Figure 4:
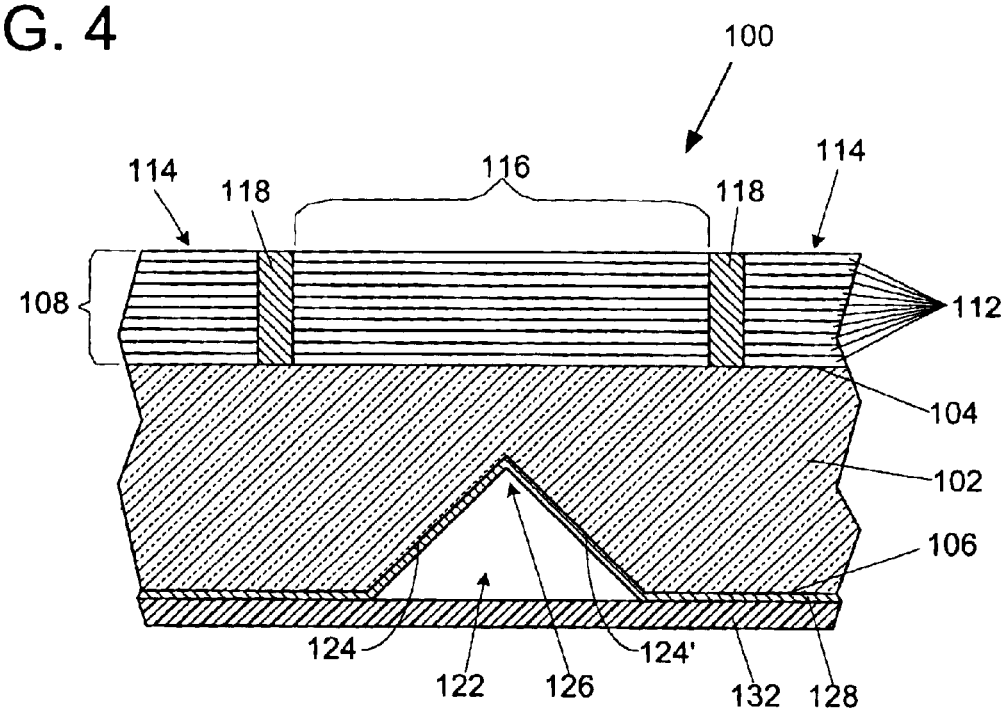
FIG. 4 is a side cross-sectional view of the backside metallization layer of the microelectronic device wafer abutting a dicing tape, according to the present invention.

As shown in FIG. 3, the semiconductor wafer back surface 106 is metallized with a thermally conductive material or materials, including, but not limited to gold, silver, chromium, titanium, tungsten, nickel, and alloys thereof (nickel vanadium alloy is preferred), to form a backside metallization layer 128. The backside metallization layer 128 may be formed by any method known in the art, including, but not limited to, chemical vapor deposition, sputter deposition (preferred), plating, and the like. The backside metallization layer 128 may comprise multiple layers of material and preferably comprises a layer of titanium about 500 angstroms thick, a layer of nickel vanadium about 5000 angstroms thick on the titanium layer, and a gold layer about 500 angstroms thick. After the formation of the backside metallization layer 128, a flexible, dicing tape 132 is abutted against the backside metallization layer 128, as shown in FIG. 4.

Figure 5:
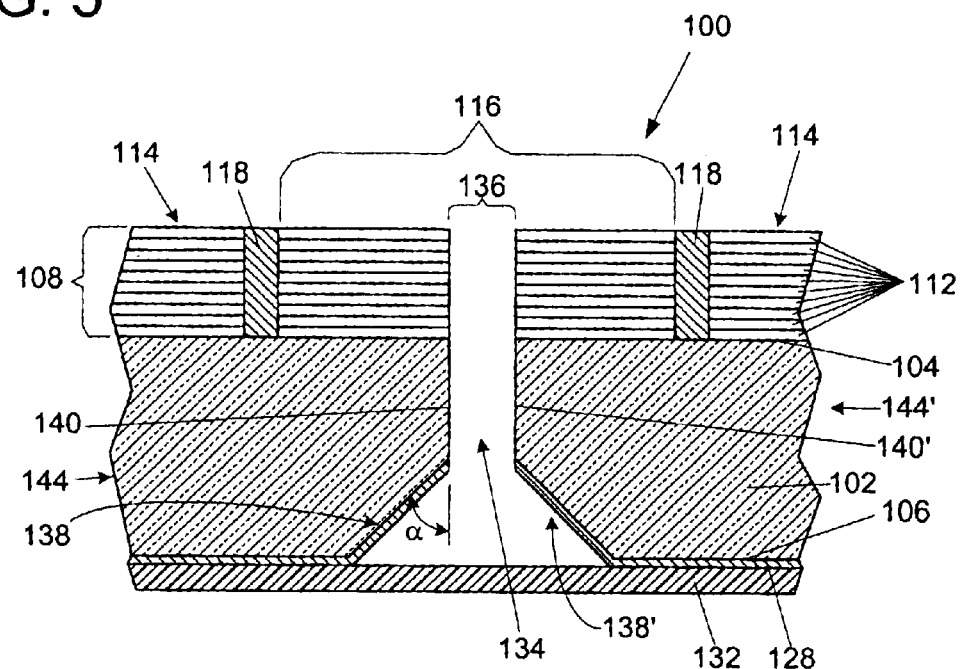
FIG. 5 is a side cross-sectional view of the microelectronic device wafer of FIG. 4 after conventional wafer dicing, according to the present invention.

The microelectronic device wafer 100 is then diced from the semiconductor wafer active surface 104, as shown in FIG. 5, with a standard wafer saw to form dice channel 134 that is substantially perpendicular to the semiconductor wafer active surface 104, thereby singulating individual microelectronic dice 144, 144' from the microelectronic device wafer 100. The dicing results in beveled sidewalls 138, 138' extending between the semiconductor wafer back surface 106 and sidewalls 140, 140' of the dice channel 134, respectively. Preferably, the standard wafer saw is centered opposite the intersection location 126 (shown in FIGS. 2 and 3) such that the dice channel width 136 removes the intersection location 126 and results in the dice channel sidewalls 140, 140' having substantially the same height.

Figure 10:
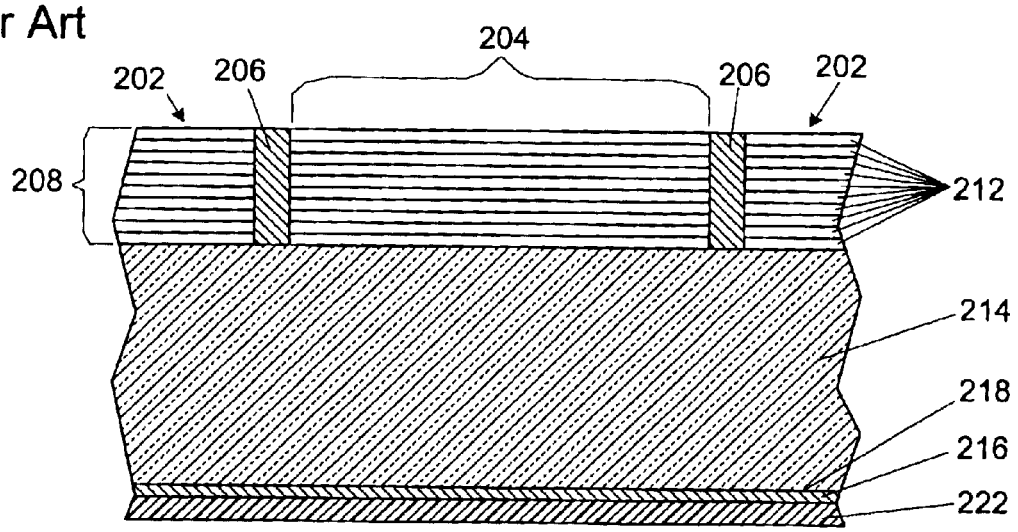
FIG. 10 is a side cross-sectional view of the scribe street areas of a microelectronic device wafer along line 10—10 of FIG. 9, as known in the art.
Figure 11:
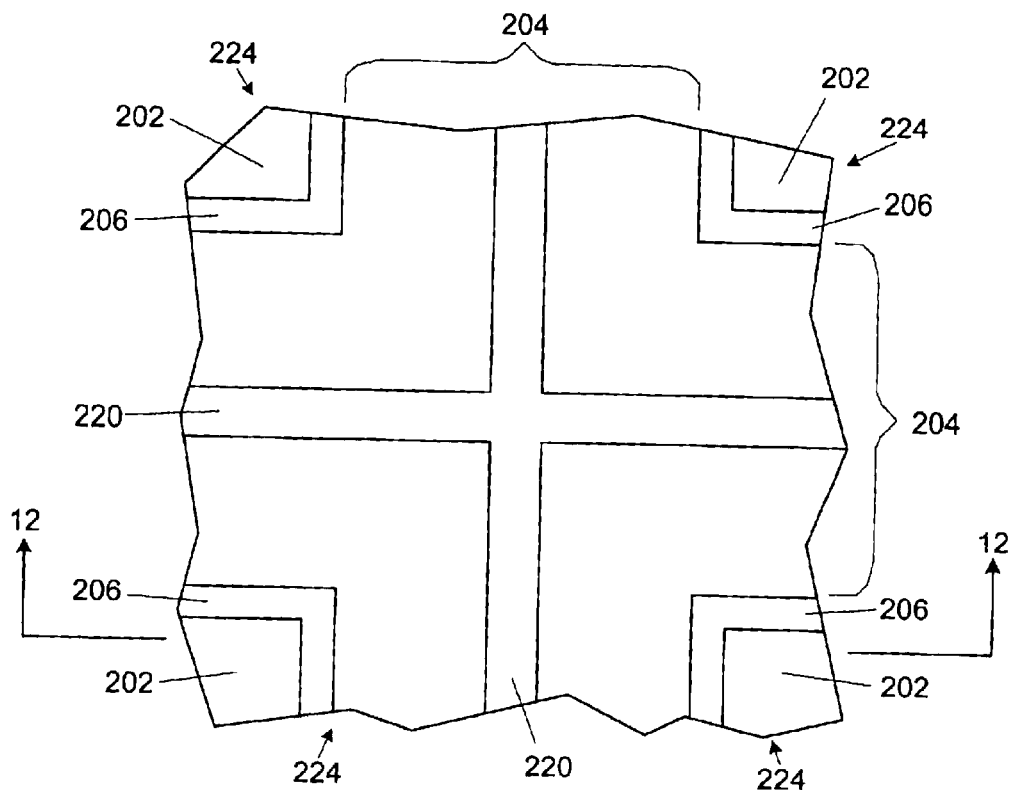
FIG. 11 is a top plan view of the microelectronic device wafer of FIGS. 9 and 10 after wafer dicing, as known in the art.
Figure 12:
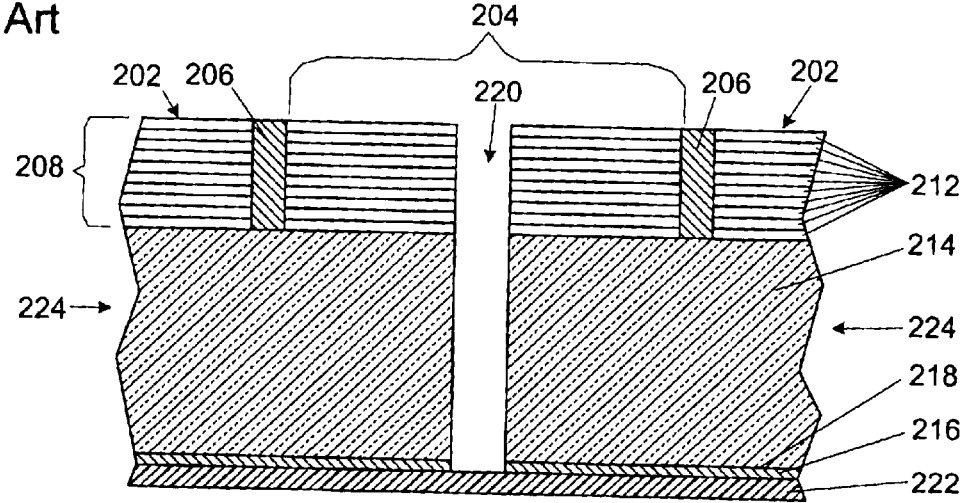
FIG. 12 is a side cross-sectional view of the scribe street areas of the microelectronic device wafer along line 12—12 of FIG. 11, as known in the art
Figure 13:
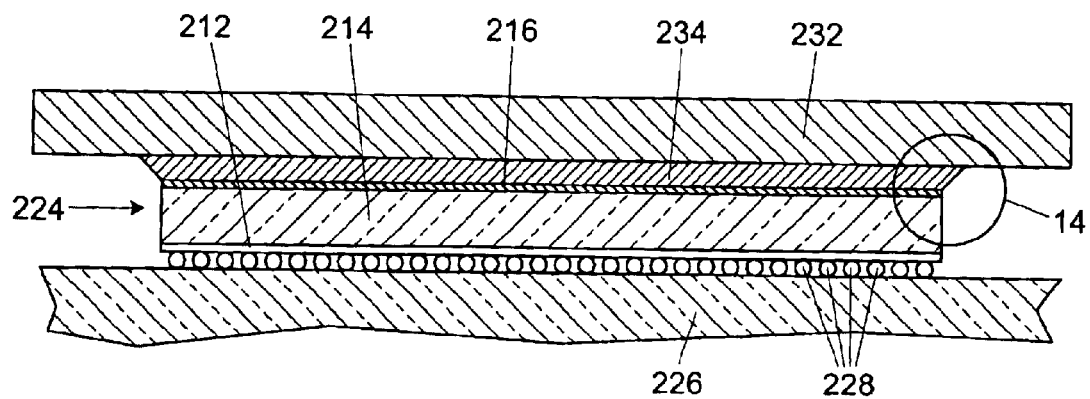
FIG. 13 is a side cross-sectional view of a microelectronic die attached to a substrate and a heat dissipation device attached to a back surface thereof, as known in the art.

The substantially V-shaped notch 122, as shown in FIG. 3, presents an angle of attack for the backside metallization layer 128 within the substantially V-shaped notch 122 regard to the wafer saw during dicing, rather than no angle of attack, as with the backside metallization layer 216 shown in FIG. 10 (i.e., perpendicular to the dicing wafer saw). This angle of attack greatly reduces or eliminates chipping of the backside metallization layer 128 during wafer dicing. Of course, for example, an angle between the beveled sidewall 138 and the dice channel sidewall 140 from the can be varied to present any desired or required angle of attack. Preferably, the angle is between about 30 degrees and about 60 degrees. Most preferably, the angle is about 45 degrees. For example, the substantially V-shaped notch 122 is preferably about one-tenth to one-half of the thickness of the microelectronic device wafer 102. For an exemplary microelectronic device wafer 102 having a thickness of 750 microns, the preferred depth would be about 250 microns.

Figure 6:
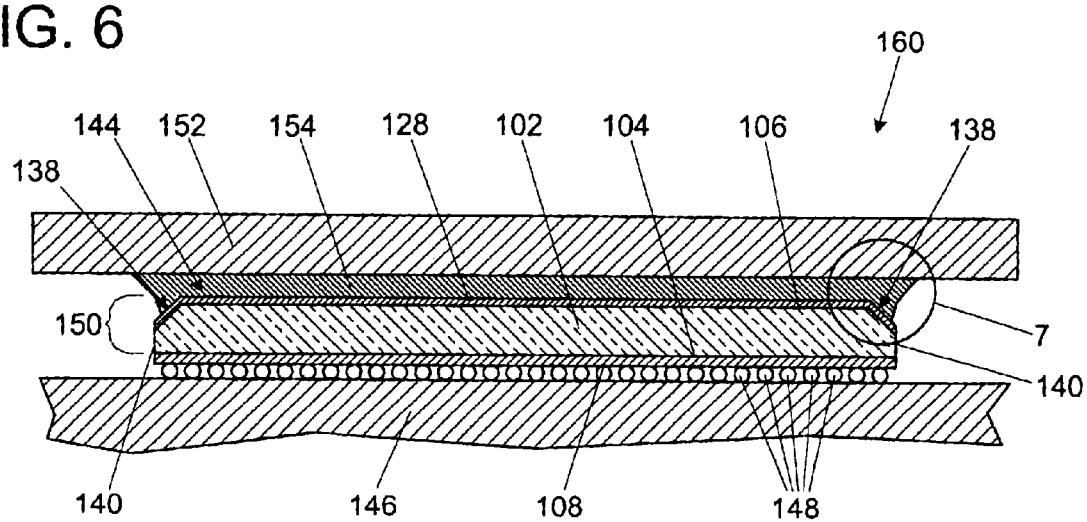
FIG. 6 is a side cross-sectional view of a microelectronic die attached to a substrate and a heat dissipation device attached to a back surface thereof, according to the present invention.

FIG. 6 illustrates a microelectronic device assembly 160, according to the present invention. As shown in FIG. 6, the microelectronic die 144 includes a beveled sidewall 138 and a dice channel sidewall 140 which comprise at least one microelectronic die side 150. The microelectronic die 144 is attached to a substrate 146, such as a package substrate or a motherboard, by a plurality of solder balls 148 extending between interconnection layer 108 of the microelectronic die 144 and the substrate 146, using flip chip assembly processes known in the art. A heat dissipation device 152 is attached to the backside metallization layer 128 by a thermal interface material 154. The thermal interface material 154 is usually a metal or solder material including, but not limited to, lead, tin, indium (preferred), silver, copper, and alloys thereof. The thickness of the thermal interface material 154 between the heat dissipation device 152 and the backside metallization layer 128 may be between about 25 microns and about 300 microns thick, but is not limited to this range. A preferred thickness range is between about 150 microns and 200 microns.

The attachment of heat dissipation device 152 to the backside metallization layer 128 can be achieved by a number of methods, including, but not limited to the following three methods. First and preferred, the thermal interface material 154, in a thin preformed structure, is sandwiched between the heat dissipation device 152 and the backside metallization layer 128 and held together with a clamp. The clamped assembly is sent through a solder reflow oven where the thermal interface material 154 melts and forms a solid-state bond with the heat dissipating device 152 and the backside metallization layer 128 including the portion of the backside metallization layer 128 along the bevel sidewall 138. In a second method, the thermal interface material 154 is pre-applied to the heat dissipation device 152 by solder reflow. The heat dissipating device 152 is then placed on the backside metallization layer 128 and held together with a clamp. The clamped assembly is sent through a solder reflow oven where the thermal interface material 154 melts and forms a solid-state bond with the backside metallization layer 128 including the portion of metallization layer 128 along the bevel sidewall 138. In a third method, the thermal interface material 154 is pre-applied to the backside metallization layer 128 by solder reflow. The heat dissipation device 152 is then placed on the thermal interface material 154 and held together with a clamp. The clamped assembly is sent through a solder reflow oven where the thermal interface material 154 melts and forms a solid-state bond with the backside metallization layer 128 including the portion of metallization layer 128 along the bevel sidewall 138.

Figure 7:
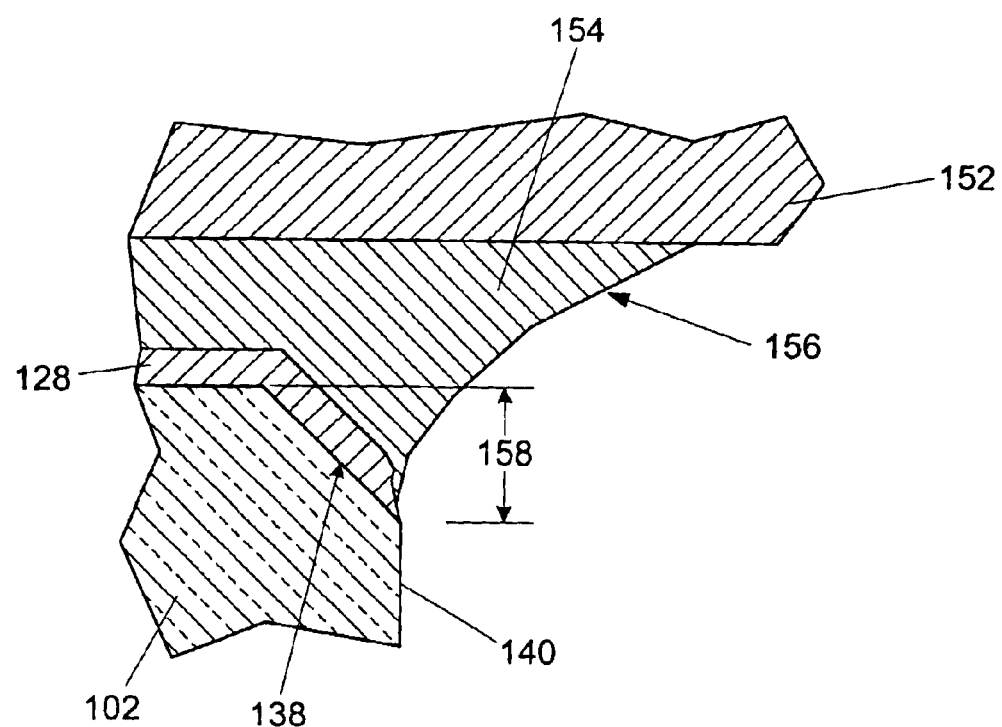
FIG. 7 is a side cross-sectional view of a close-up of insert 7 of FIG. 6, according to the present invention.
Figure 8:
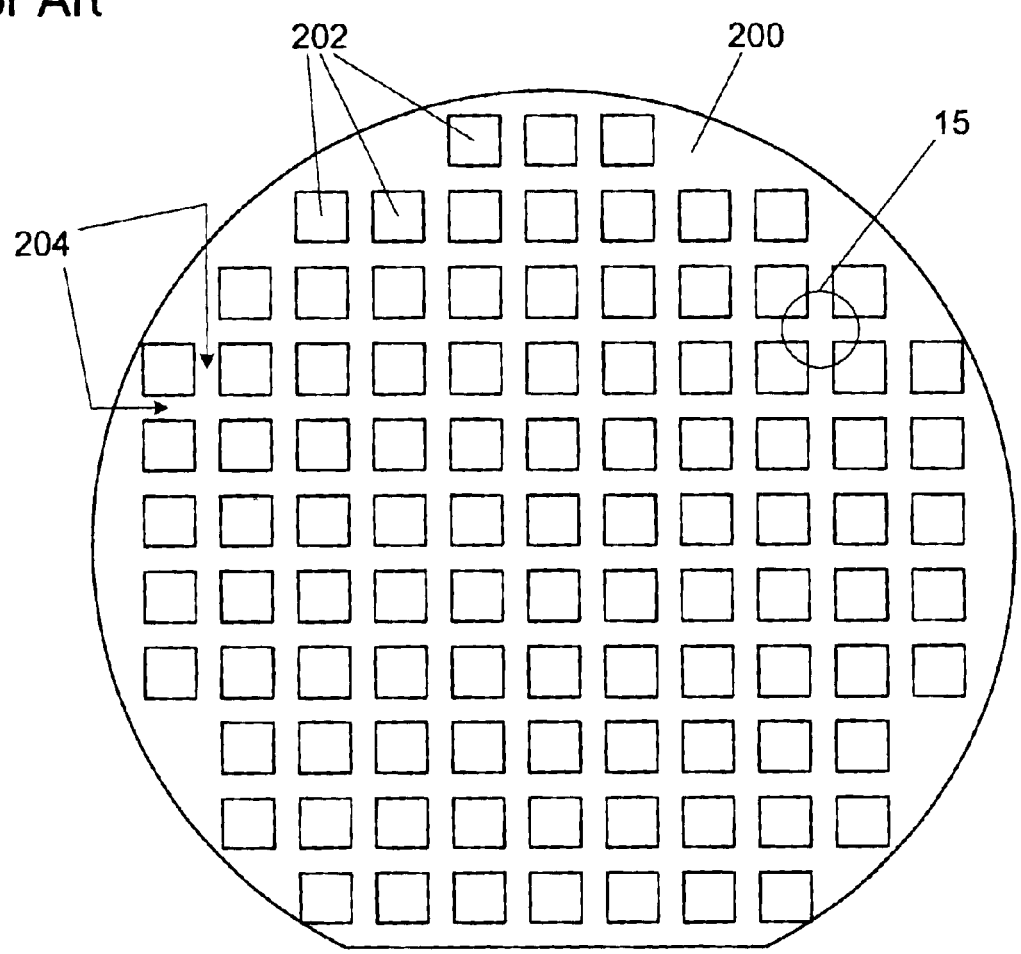
FIG. 8 is a top plan view of a conventional microelectronic device wafer having a plurality of unsingulated microelectronic devices, as known in the art.

During the attachment of the heat dissipation device 152 with the thermal interface material 154, the thermal interface material 154 wets and wicks/extends between the backside metallization layer 128 on the beveled sidewall 138 and the heat dissipation device 152 to from a fillet 156, as shown in FIG. 7. The backside metallization layer 128 on the beveled sidewall 138 will result in a predictable fillet 156. The fillet 156 can be affected by varying a depth 158 of the substantially V-shaped notch 122, varying the angle (see FIG. 3), and the selection of the thermal interface material 154, as will be understood by those skilled in the art. Thus, the position of the fillet 156 on the beveled sidewalls 138 can be controlled. Therefore, the thermal interface material 154 can avoid any chipping that may result from the dicing of the microelectronic device wafer.

Figure 14:
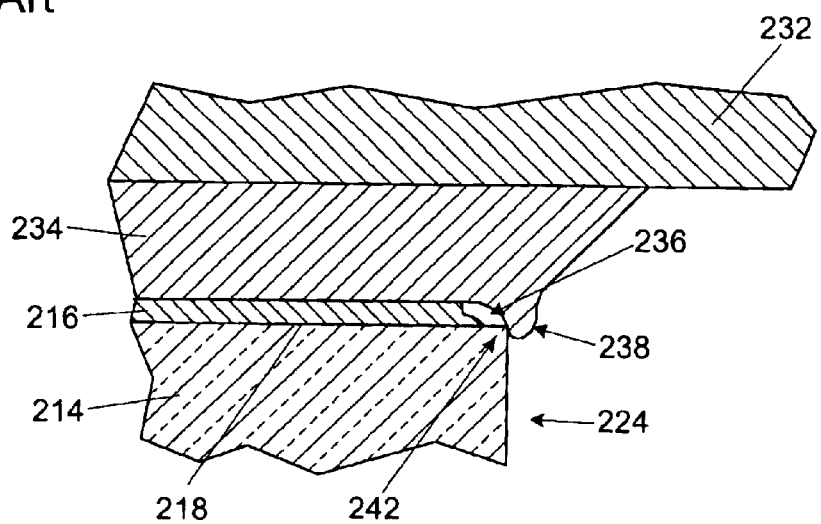
FIG. 14 is a side cross-sectional view of a close-up of insert 14 of FIG. 13, as known in the art.

Furthermore, the beveled sidewall 138 eliminates the microelectronic die corners/edges 242, which are shown in FIG. 14. This, in turn, greatly reduces or eliminates stresses that occur at the interface between the backside metallization layer 128 and the thermal interface material 154 during the operation of the microelectronic die 144, thereby greatly reducing the chances of delamination.

Moreover, thermal interface materials 154 are generally more compliant than the backside metallization layer 128 and the semiconductor wafer 102. Thus, the thicker thermal interface material 154 over the beveled sidewalls 138 will allow the thermal interface material 154 to deform to accommodate and relieve stress, thereby also greatly reducing the chances of delamination.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic device assembly, comprising:
   a microelectronic die having an active surface, a back surface, and at least one side;
   said at least one microelectronic die side comprising at least one beveled sidewall and at least one channel sidewall, wherein said at least one beveled sidewall extends between said channel sidewall and said microelectronic die back surface;
   a metallization layer disposed on said microelectronic die back surface and said at least one beveled sidewall; and
   a heat dissipation device attached to said microelectronic die back surface with a thermal interface material, wherein said thermal interface material forms at least one fillet between said heat dissipation device and said at least one beveled sidewall.

2. The microelectronic device of claim 1, wherein said at least one beveled sidewall is between about 30 degrees and about 60 degrees from said at least one channel sidewall.

3. The microelectronic device of claim 2, wherein said at least one beveled sidewall is about 45 degrees from said at least one channel sidewall.

4. The microelectronic device of claim 1, wherein said metallization layer is at least one metal selected from the group consisting of gold, silver, chromium, titanium, tungsten, vanadium, and nickel.

5. The microelectronic device assembly of claim 1, wherein said thermal interface material is selected from the group consisting of lead, tin, indium, silver, copper, and alloys thereof.

6. The microelectronic device assembly of claim 1, wherein at least a portion of a fillet of said thermal interface material extend from said metallization layer on said microelectronic die beveled sidewall to said heat dissipation device.

* * * * *

UNITED STATES PATENT AND TRADEMARK OFFICE
CERTIFICATE OF CORRECTION

PATENT NO. : 6,790,709 B2
DATED : September 14, 2004
INVENTOR(S) : Dias et al.

It is certified that error appears in the above-identified patent and that said Letters Patent is hereby corrected as shown below:

Column 2,
Line 47, delete "call" and insert -- can --.

Column 3,
Line 42, delete "tile" and insert -- the --.

Column 4,
Line 32, after "is" delete "a".

Signed and Sealed this

Thirty-first Day of May, 2005

JON W. DUDAS
*Director of the United States Patent and Trademark Office*